United States Patent
Funahashi et al.

(10) Patent No.: US 6,860,938 B2
(45) Date of Patent: Mar. 1, 2005

(54) METHOD FOR PRODUCING SINGLE CRYSTAL OF COMPOSITE OXIDE

(75) Inventors: Ryoji Funahashi, Ikeda (JP); Ichiro Matsubara, Ikeda (JP); Masahiro Shikano, Ikeda (JP)

(73) Assignee: National Institute of Advanced Technology, Tokyo (JP)

( * ) Notice: Subject to any disclaimer, the term of this patent is extended or adjusted under 35 U.S.C. 154(b) by 0 days.

(21) Appl. No.: 10/481,702

(22) PCT Filed: May 27, 2002

(86) PCT No.: PCT/JP02/05104

§ 371 (c)(1),
(2), (4) Date: Dec. 22, 2003

(87) PCT Pub. No.: WO03/000605

PCT Pub. Date: Jan. 3, 2003

(65) Prior Publication Data

US 2004/0177800 A1 Sep. 16, 2004

(30) Foreign Application Priority Data

Jun. 25, 2001 (JP) ............................ 2001-191566

(51) Int. Cl.[7] .................................. C30B 1/04

(52) U.S. Cl. .................. 117/4; 117/7; 117/8; 117/10; 117/944

(58) Field of Search ......................... 117/944, 4, 7, 117/8, 10

(56) References Cited

U.S. PATENT DOCUMENTS

| | | | |
|---|---|---|---|
| 5,016,563 A | * | 5/1991 | Murakami et al. ...... 118/723 FI |
| 6,074,477 A | * | 6/2000 | Imaeda et al. ................ 117/13 |
| 6,759,587 B2 | * | 7/2004 | Toshima et al. ......... 136/236.1 |

FOREIGN PATENT DOCUMENTS

| | | |
|---|---|---|
| EP | 1 174 933 | 1/2002 |
| JP | 2001-019544 | 1/2001 |
| JP | 2001-064021 | 3/2001 |
| JP | 2002-100814 | 4/2002 |

OTHER PUBLICATIONS

Ryoji Funahashi, et al., "An Oxide Single Crystal with High Thermoelectric Performance in Air," Japanese Journal of Applied Physics, vol. 39, No. 11B, pp. 1127–1129 Nov. 15, 2000.

* cited by examiner

*Primary Examiner*—Robert Kunemund
(74) *Attorney, Agent, or Firm*—Knobbe, Martens, Olson & Bear LLP

(57) ABSTRACT

The present invention provides a method by which an oxide material having excellent thermoelectric conversion performance can be produced by a simple process. Specifically, the present invention provides a method for producing a composite oxide single crystal in which a mixture of raw substances including a Bi-containing substance, a Sr-containing substance, a Ca-containing substance, a Co-containing substance and a Te-containing substance, or a mixture of raw substances also including a Pb-containing substance in addition to the above-mentioned substances, is heated in an oxygen-containing atmosphere at a temperature below the melting point of any of the raw substances. The composite oxide single crystal produced by the method of the present invention is a ribbon-shaped fibrous single crystal that is about 10 to 10,000 μm long, about 20 to 200 μm wide, and about 1 to 5 μm thick. According to the method of the present invention, a composite oxide single crystal with excellent thermoelectric conversion performance can be produced simply by heating a mixture of raw substances at a relatively low temperature, below the melting point of any of the raw substances, meaning that a relatively easy and safe heat treatment operation can be performed, which contributes to cost reduction.

6 Claims, 5 Drawing Sheets

BC-222 structure

- Co
- Bi, Pb
- Sr, Ca
- O

Co-225 structure

- Co
- Sr, Ca, Bi
- O

US 6,860,938 B2

METHOD FOR PRODUCING SINGLE CRYSTAL OF COMPOSITE OXIDE

This application is the U.S. National Phase under 35 U.S.C. §371 of International Application PCT/JP02/05104, filed on May 27, 2002, which claims priority of Japanese Patent Application No. 2001-191566, filed on Jun. 25, 2001. The International Application was published under PCT Article 21(2) in a language other than English.

TECHNICAL FIELD

The present invention relates to a method for producing a composite oxide single crystal.

BACKGROUND ART

In our country, only about 30% of the primary energy supply is transformed into available energy and, accordingly, ultimately about 70% of the energy supply is discarded as heat into the atmosphere. Heat evolved by combustion in industrial plants, garbage incineration facilities or the like is disposed of into the atmosphere without being converted into other energy forms. In this way, we human beings are wasting a tremendous amount of thermal energy, with a very limited amount being acquired through processes such as burning fossil fuels.

One effective means of increasing the proportion of available energy is to utilize the thermal energy that is being released into the atmosphere. This can be effectively accomplished by thermoelectric conversion, by which thermal energy is directly converted into electrical energy. Thermoelectric conversion is a method for converting energy in which, utilizing the Seebeck effect, electric power is generated by giving a temperature difference between both ends of a thermoelectric material to produce an electric potential difference. More specifically, in this thermoelectric power generation, electric power is generated simply by setting one end of a thermoelectric material in a region that has been heated to a high temperature by waste heat, setting the other end of the material in the atmosphere (ambient temperature), and then connecting a conductor to each of these ends. This method completely eliminates any need for movable devices, such as motors or turbines, which are usually required for generating electric power, thus leading to cost reduction, and eliminating the emission of gases produced by combustion, etc. The method also allows electric power to be generated continuously until the thermoelectric material is deteriorated.

Due to the advantages described above, thermoelectric power generation has been recognized as a technique that will help to resolve the energy-related problems that are likely to arise in the future. To perform thermoelectric power generation, it is necessary to develop thermoelectric materials having high thermoelectric conversion efficiency, as well as excellent heat resistance and chemical durability, etc. Substances presently known to have high thermoelectric conversion efficiency are intermetallic compounds. Particularly, TeAgSb-containing metallic compounds have high conversion efficiency at temperatures ranging from about 600 to 1,000K, i.e., the temperature region of waste heat. However, Te and Sb are rare and toxic elements, and cannot be used in air because they are readily oxidizable. Such drawbacks limit the extent to which TeAgSb-containing metallic compounds can be used as practical materials. It is thus hoped to develop materials that are composed of elements which are abundantly available but of low toxicity, and which have superior heat resistance and chemical durability, as well as high thermoelectric conversion efficiency.

While metallic oxides are conceivable as materials having excellent heat resistance and chemical durability, their thermoelectric conversion efficiency is lower by an order of magnitude compared with that of TeAgSb-containing metallic compounds. In fact, known oxides having high electric conductivity, i.e., those whose electrical resistivity is about 10 mΩ cm or less, show a Seebeck coefficient as low as a few tens of $\mu$V/K or less.

To address this problem, various studies have been conducted to search for oxides that have high thermoelectric conversion efficiency. For instance, Japanese Patent Nos. 3089301 and 3069701 disclose some composite oxides as such oxides.

In order to make practical use of composite oxides as thermoelectric materials, it is hoped that a method will be developed by which composite oxides with even higher thermoelectric conversion performance can be produced using a simple process.

DISCLOSURE OF THE INVENTION

A primary object of the present invention is to provide a method by which an oxide material with excellent thermoelectric conversion performance can be produced using a simple process.

The present inventors conducted intensive studies to achieve the foregoing object, and found the following. In a case where a mixture including a Bi-containing substance, a Sr-containing substance, a Ca-containing substance and a Co-containing substance, as well as a Te-containing substance, or a mixture also including a Pb-containing substance in addition to the above-mentioned substances, is used as a mixture of raw substances and fired in an oxygen-containing atmosphere, a fibrous single crystal of composite oxide containing Co and O as constitutional elements, and further containing Bi, Pb, Sr, Ca and the like is grown from the surface of a sintered product, simply by heating at a temperature below the melting point of any of the raw substances. The formed single crystal exhibits excellent thermoelectric conversion performance. The present invention was accomplished based on these findings.

The present invention therefore provides a method for producing a composite oxide single crystal, as defined below.

1. A method for producing a composite oxide single crystal comprising the step of heating a mixture of raw substances in an oxygen-containing atmosphere at a temperature below the melting point of any of the raw substances, the mixture of raw substances comprising a Bi-containing substance, a Sr-containing substance, a Ca-containing substance, a Co-containing substance and a Te-containing substance, or the mixture of raw substances comprising the above-mentioned substances and a Pb-containing substance.

2. The method for producing a composite oxide single crystal according to item 1 above, wherein the composite oxide single crystal is a fibrous single crystal grown from the surface of a sintered product.

3. The method for producing a composite oxide single crystal according to item 1 above, wherein the mixture of raw substances is heated at a temperature of 800 to 1,000° C.

4. The method for producing a composite oxide single crystal according to any one of items 1 to 3 above, wherein the Bi-containing substance, Pb-containing substance, Sr-containing substance, Ca-containing substance and Co-containing substance are present in the mixture of raw substances at a Bi/Pb/Sr/Ca/Co/Te atomic ratio of 1.6–2.5/0–0.6/1.8–2.5/1.8–2.5/2.0/0.5–1.5, and wherein the formed oxide single crystal has an average composition represented by $Bi_{1.5-3.1}Pb_{0-0.5}Sr_{1.3-2.2}Ca_{0-0.8}Co_2O_{9-x}$ ($0 \leq x \leq 1.0$).

5. The method for producing a composite oxide single crystal according to any one of items 1 to 3 above, wherein the Bi-containing substance, Sr-containing substance, Ca-containing substance and Co-containing substance are present in the mixture of raw substances at a Bi/Sr/Ca/Co/Te atomic ratio of 1.8–2.5/1.8–2.5/1.8–2.5/2.0/0.5–1.5, and wherein the formed oxide single crystal has an average composition represented by $Bi_{1.9-3.1}Sr_{1.3-2.2}Ca_{0-0.8}Co_2O_{9-x}$ ($0 \leq x \leq 1.0$).

6. The method for producing a composite oxide single crystal according to any one of items 1 to 3 above, wherein the Bi-containing substance, Sr-containing substance, Ca-containing substance and Co-containing substance are present in the mixture of raw substances at a Bi/Sr/Ca/Co/Te atomic ratio of 0.5–1.5/0.5–1.5/0.5–1.5/2.0/0.5–1.5, and wherein the formed oxide single crystal has an average composition represented by $Ca_{1.3-3.0}Sr_{0-0.5}Bi_{0-0.5}Co_2O_{5-x}$ ($0 \leq x \leq 1.0$).

The method for producing a composite oxide single crystal according to the present invention uses a mixture of raw substances comprising a Bi-containing substance, a Sr-containing substance, a Ca-containing substance, a Co-containing substance and a Te-containing substance, or mixture of raw substances also comprising a Pb-containing substance in addition to the above-mentioned substances. These raw substances may be selected without particular limitation from those that will yield oxides upon firing, and may be, for example, metals, oxides, or compounds such as carbonates. Examples of Bi-containing substances include bismuth oxide ($Bi_2O_3$, $Bi_2O_5$), bismuth nitrate ($Bi(NO_3)_3$), bismuth chloride ($BiCl_3$), bismuth hydroxide ($Bi(OH)_3$), and alkoxide compounds ($Bi(OCH_3)_3$, $Bi(OC_2H_5)_3$, $Bi(OC_3H_7)_3$, etc.). Examples of Sr-containing substances include strontium oxide (SrO), strontium chloride ($SrCl_2$), strontium carbonate ($SrCO_3$), strontium nitrate ($Sr(NO_3)_2$), strontium hydroxide ($Sr(OH)_2$), and alkoxide compounds ($Sr(OCH_3)_2$, $Sr(OC_2H_5)_2$, $Sr(OC_3H_7)_2$, etc.). Examples of Ca-containing substances include calcium oxide (CaO), calcium chloride ($CaCl_2$), calcium carbonate ($CaCO_3$), calcium nitrate ($Ca(NO_3)_2$), calcium hydroxide ($Ca(OH)_2$), and alkoxide compounds ($Ca(OCH_3)_2$, $Ca(OC_2H_5)_2$, $Ca(OC_3H_7)_2$, etc.). Examples of Co-containing substances include cobalt oxide (CoO, $Co_2O_3$, $Co_3O_4$), cobalt chloride ($CoCl_2$), cobalt carbonate ($CoCO_3$), cobalt nitrate ($Co(NO_3)_2$), cobalt hydroxide ($Co(OH)_2$), and alkoxide compounds ($Co(OC_3H_7)_2$, etc.). Examples of Te-containing substances include tellurium oxide ($TeO_2$), tellurium nitrate ($Te(NO_3)_4$), tellurium chloride ($TeCl_4$), and alkoxide compounds ($Te(OCH_3)_4$, $Te(OC_2H_5)_4$, $Te(OC_3H_7)_4$, etc.). Examples of Pb-containing substances include lead oxide (PbO), lead nitrate ($Pb(NO_2)_2$), lead chloride ($PbCl_2$), lead hydroxide ($Pb(OH)_2$), and alkoxide compounds ($Pb(OCH_3)_2$, $Pb(OC_2H_5)_2$, $Pb(OC_3H_7)_2$, etc.). It is also possible to use raw substances containing two or more of the elements that are to constitute the contemplated composite oxide.

The ratio at which the raw substances are mixed may be determined depending on the composition desired for the resulting oxide single crystal. When the Bi-containing substance, Pb-containing substance, Sr-containing substance, Ca-containing substance and Co-containing substance are present in the mixture of raw substances at a Bi/Pb/Sr/Ca/Co/Te atomic ratio of 1.6–2.5/0–0.6/1.8–2.5/1.8–2.5/2.0/0.5–1.5, the formed oxide single crystal has an average composition represented by $Bi_{1.5-3.1}Pb_{0-0.5}Sr_{1.3-2.2}Ca_{0-0.8}Co_2O_{9-x}$ ($0 \leq x \leq 1.0$). When the above substances are mixed, but excluding the Pb-containing substance, at a Bi/Sr/Ca/Co/Te atomic ratio of 1.8–2.5/1.8–2.5/1.8–2.5/2.0/0.5–1.5, the formed oxide single crystal has an average composition represented by $Bi_{1.9-3.1}Sr_{1.3-2.2}Ca_{0-0.8}Co_2O_{9-x}$ ($0 \leq x \leq 1.0$).

As another example, when the Bi-containing substance, Sr-containing substance, Ca-containing substance and Co-containing substance are present at a Bi/Sr/Ca/Co/Te atomic ratio of 0.5–1.5/0.5–1.5/0.5–1.5/2.0/0.5–1.5, the formed oxide single crystal has an average composition represented by $Ca_{1.3-3.0}Sr_{0-0.5}Bi_{0-0.5}Co_2O_{5-x}$ ($0 \leq x \leq 1.0$).

The method of the present invention uses a mixture of raw substances containing the above-mentioned Te-containing substance, and thereby enables a composite oxide single crystal to grow from the surface of a sintered product using a simple method in which the mixture of raw substances is heated at a temperature below the melting point of any of the raw substances. The formed composite oxide is a ribbon-shaped fibrous single crystal of composite oxide which does not contain Te, but does contain Co and O. The composite oxide may also contain, as other constitutional elements, Bi, Pb, Sr, Co, etc., depending on the composition of the mixture of raw substances.

The method for mixing the raw substances is not limited, and may be selected from methods that allow for thorough mixing of the raw substances. If necessary, the raw substances may be crushed before firing in a suitable manner to thereby enhance the efficiency of the firing reaction.

For heat treatment, the mixture of raw substances may be formed into a desired shape. Shaping the mixture under pressure may increase the efficiency of the firing reaction.

The temperature for heat treatment is not particularly limited, and may be determined within the range that will allow for the formation of a sintered product but not to exceed the melting point of any of the raw substances, usually within the range of about 800 to 1,000° C. The atmosphere for heat treatment is not particularly limited as long as it is an oxygen-containing atmosphere, such as air or an oxygen stream. When an oxygen stream is used for heat treatment, it may be adjusted to a flow rate of about 300 ml/sec or less. The oxygen content of the resulting composite oxide can be controlled by varying the flow rate of oxygen during heat treatment. The tendency is that the greater the oxygen flow, the higher the oxygen content. Variation in oxygen content in the composite oxide does not have a significant influence on the electric characteristics of the oxide.

The means used for performing heat treatment is not particularly limited, and can be any desired means, for example, an electric furnace or a gas furnace.

The time length of heat treatment is not particularly limited, and may be determined in accordance with the progress of growth of the target single crystal, usually within the range of about 60 to 300 hours.

If necessary, it is also possible to preheat the mixture of raw substances at a temperature lower than the temperature used for growing the single crystal, and then heat the obtained crystalline product under the conditions specified above. When a raw substance such as carbonate or an organic compound is used, it is preferable to decompose it by calcination to form an oxide prior to the above firing, and then heat the obtained oxide to produce the contemplated composite oxide. The conditions for calcination may be determined depending on the types of the raw substances. For example, the calcination may be performed at about 600 to 800° C. for about 5 to 20 hours.

One known method for producing a composite oxide single crystal involves melting raw substances and then rapidly cooling the same for solidification, and thereafter allowing a fibrous crystal to grow from the solidified product (Funahashi et al., Jpn. J. Appl. Phys. Vol. 39 (2000), pp. 1127–1129). In contrast, according to the method of the present invention, a single crystal is obtained merely by heating a mixture of raw substances at a temperature below the melting point of any of the raw substances, meaning that a relatively easy and safe heat treatment operation can be performed, which contributes to cost reduction.

The dimensions of the composite oxide single crystal produced by the method of the present invention may vary depending on the types of the raw substances, the mixing ratios of the raw substances, the heat treatment conditions or the like. Usually, the obtained composite oxide single crystal is a ribbon-shaped fibrous single crystal which is about 10 to 10,000 $\mu$m long, about 20 to 200 $\mu$m wide, and about 1 to 5 $\mu$m thick.

FIG. 1 shows an X-ray diffraction pattern (curve a) for the composite oxide obtained in Example 1 described later, and an X-ray diffraction pattern (curve b) for the composite oxide obtained in Example 12 described later.

Based on these X-ray diffraction patterns and the measurements obtained using a transmission electron microscope, the above composite oxides were interpreted to have the crystal structures as described below. The composite oxide with an average composition of $Bi_{1.5-3.1}Pb_{0-0.5}Sr_{1.3-2.2}Ca_{0-0.8}Co_2O_{9-x}$ ($0 \leq x \leq 1.0$) has a laminated structure in which two types of layers alternate in the direction of the c-axis. One type is a $CoO_2$ layer wherein unit cells, in each of which six oxygen atoms are octahedrally coordinated around one Co atom, are spread sheetwise so that adjacent cells share one edge. The other type is a rock-salt-type (NaCl) layer wherein atoms are arranged in the order of MO—M'O—M'O-MO (where M is Sr or Ca, and M' is Bi or Pb). The composite oxide with an average composition of $Ca_{1.3-3.0}Sr_{0-0.5}Bi_{0-0.5}Co_2O_{5-x}$ ($0 \leq x \leq 1.0$) has a laminated structure in which two types of layers alternate in the direction of the c-axis. One type is a $CoO_2$ layer wherein unit cells, in each of which six oxygen atoms are octahedrally coordinated around one Co atom, are spread sheetwise so that adjacent cells share one edge. The other type is a rock-salt-type (NaCl) layer wherein atoms are arranged in the order of M"O—CoO-M"O (where M"is Ca, Sr or Bi). FIG. 2 gives schematic drawings of these crystal structures, wherein the crystal structure of the former composite oxide is presented as the BC-222 structure, and the crystal structure of the latter composite oxide is presented as the Co-225 structure.

The composite oxide single crystals thus obtained have a high Seebeck coefficient, and provide excellent electric conductivity, which is characteristic to single crystals, thus demonstrating significant thermoelectric conversion performance. With such characteristics, the composite oxide single crystals can be effectively utilized as thermoelectric materials, for example, as p-type thermoelectric materials, for use in air and at high temperatures, which was impossible with the known intermetallic compound materials heretofore used.

As has been described above, according to the method of the present invention, a composite oxide single crystal with excellent thermoelectric conversion performance can be obtained simply by heating a mixture of raw substances at a relatively low temperature, below the melting point of any of the raw substances.

BEST MODES FOR CARRYING OUT THE INVENTION

The present invention will be described in further detail with reference to the Examples given below.

EXAMPLE 1

Bismuth oxide ($Bi_2O_3$), strontium carbonate ($SrCO_3$), calcium carbonate ($CaCO_3$), cobalt oxide ($Co_3O_4$), and tellurium oxide ($TeO_2$) were selected as the Bi source, Sr source, Ca source, Co source, and Te source, respectively, and these raw substances were thoroughly mixed at a Bi/Sr/Ca/Co/Te atomic ratio of 2/2/2/2/0.5. The mixture was charged into an alumina crucible, and then calcined in air using an electric furnace at 800° C. for 10 hours.

Subsequently, the obtained calcined product was crushed and then shaped under pressure. Thereafter, the formed product was heated in air at 840° C. for 20 hours to give a crystalline product. This product was heated in an oxygen stream (150 ml/min) at 920° C. for 100 hours, whereby a fibrous single crystal of composite oxide was grown on the surface of the sintered product.

Figure 1:
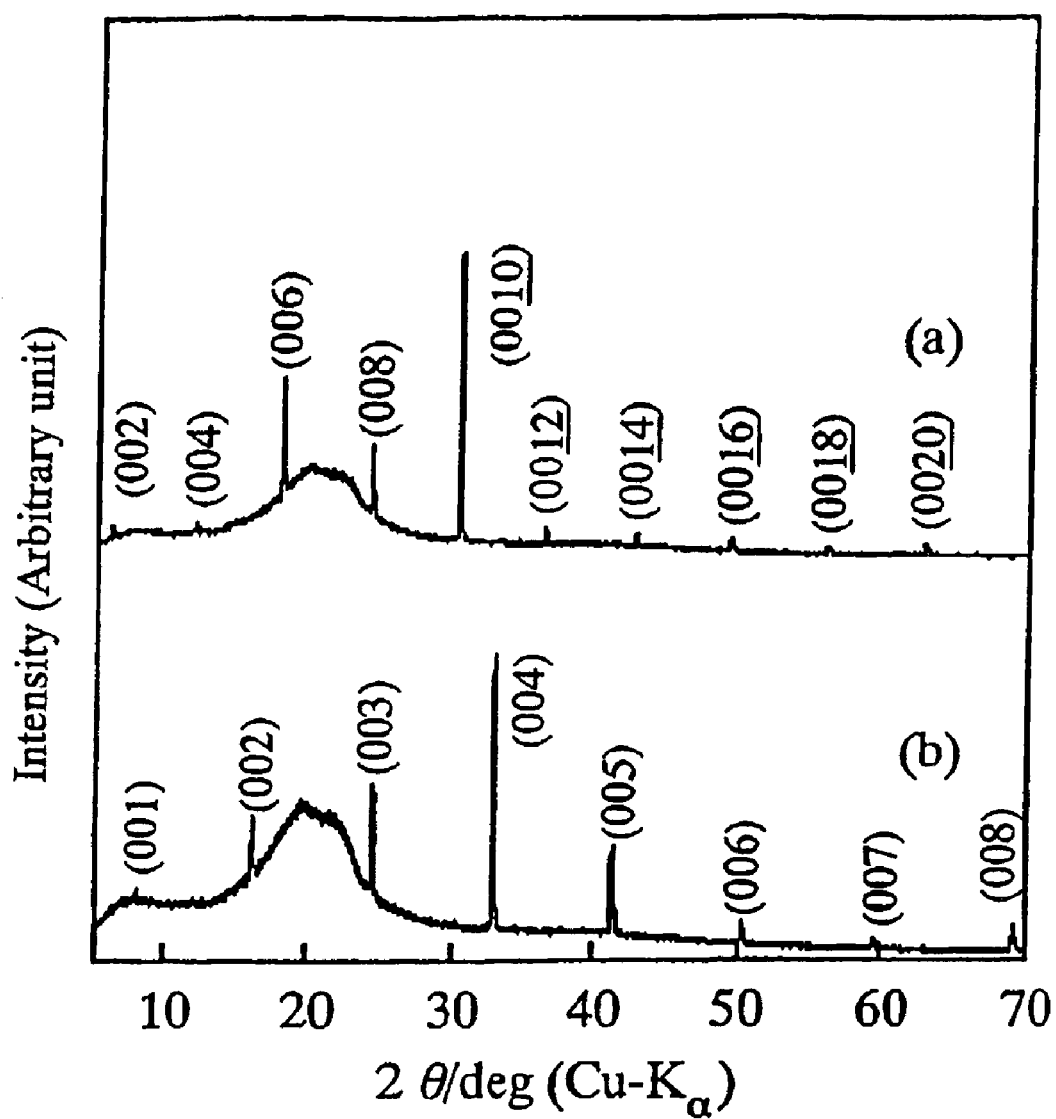
FIG. 1 shows an X-ray diffraction pattern for the composite oxide obtained in Example 1, and that for the composite oxide obtained in Example 12.
Figure 2:
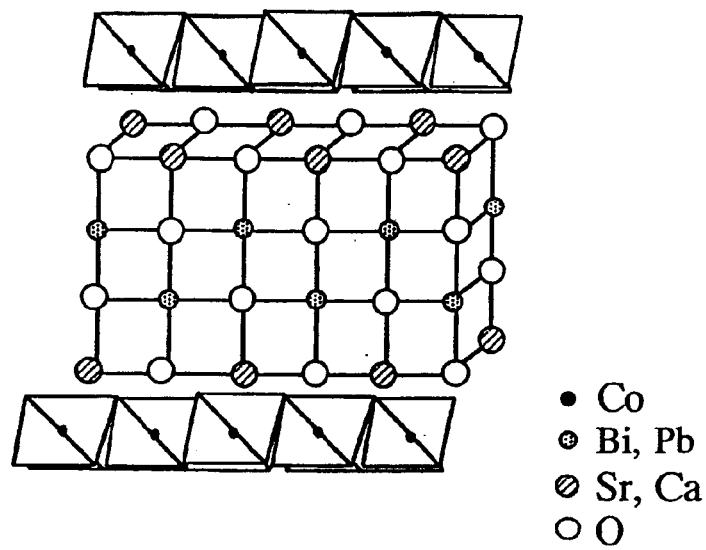
FIG. 2 schematically shows the crystal structures of composite oxides obtained in accordance with the method of the present invention.
Figure 2:
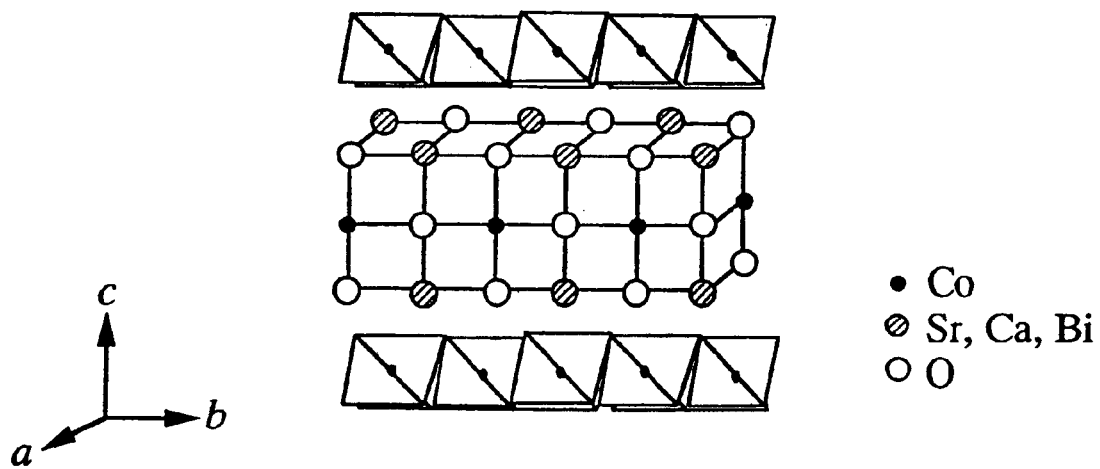
Figure 3:
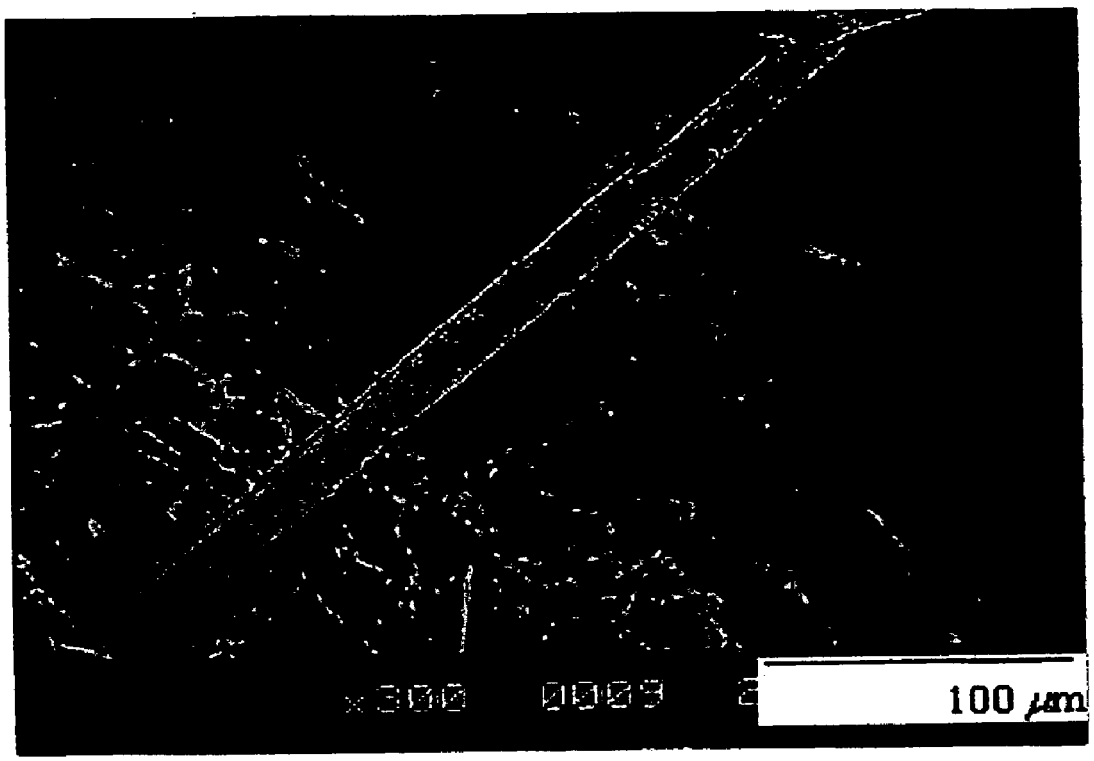
FIG. 3 is a scanning electron micrograph (SEM) of the composite oxide single crystal obtained in Example 1.

FIG. 3 is a scanning electron micrograph of the obtained composite oxide single crystal. As is clear from FIG. 3, the composite oxide single crystal produced by the method of the present invention is a ribbon-shaped crystal that has grown on the surface of the sintered product. In FIG. 3, the plane with great crystal growth is the ab plane, and the direction of thickness is the c-axis.

The composite oxide was also subjected to X-ray diffraction (XRD) and Energy dispersive X-ray analysis (EDX) for identification, and was found to have an average composition represented by $Bi_{2.1}Sr_2Ca_{0.3}Co_2O_{8.7}$.

Figure 4:
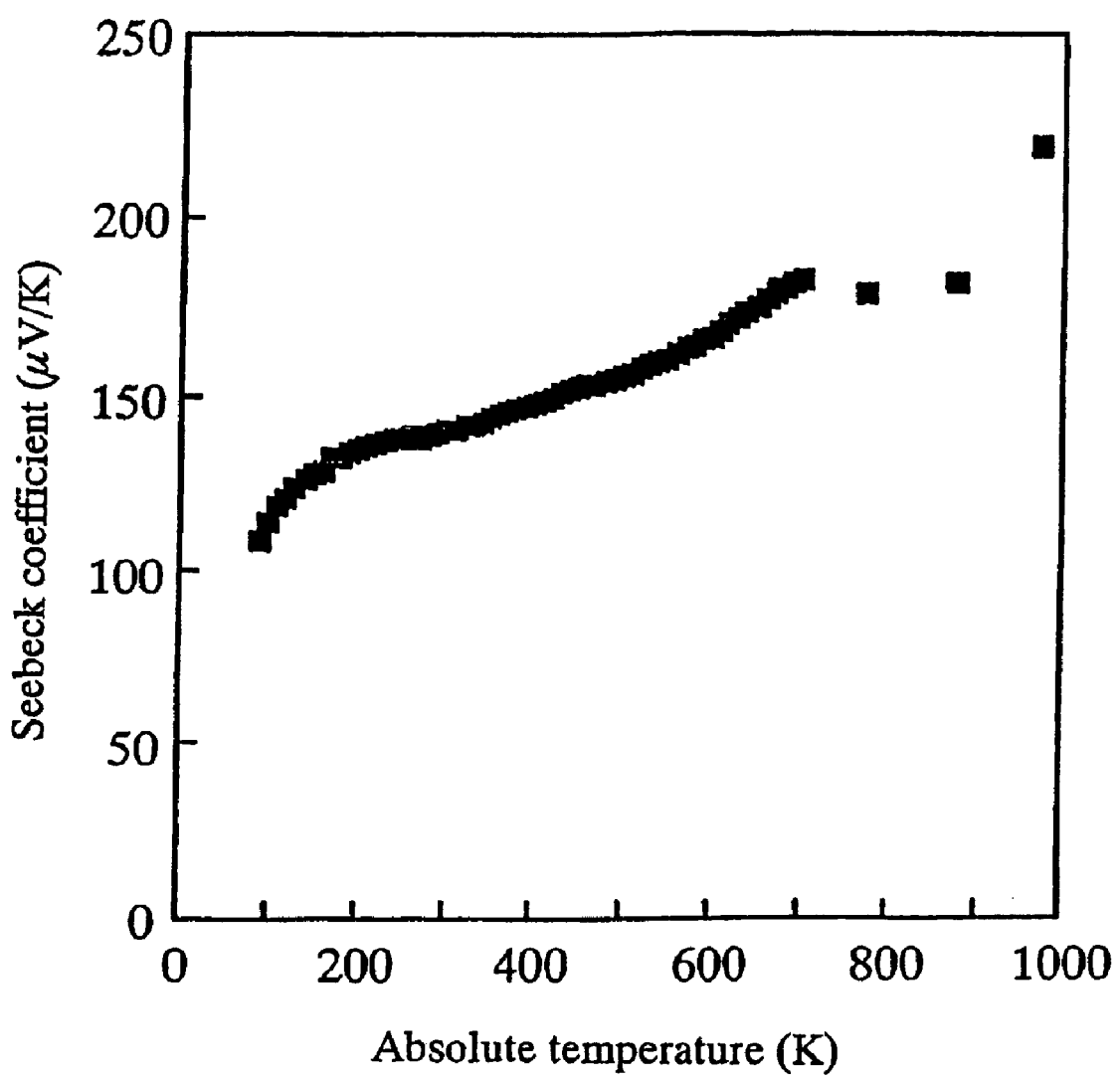
FIG. 4 is a graph showing the temperature dependency of the Seebeck coefficient of the composite oxide single crystal obtained in Example 1.

FIG. 4 is a graph showing the temperature dependency of the Seebeck coefficient (S) at 100 to 975K (absolute temperature) for the above composite oxide single crystal. It can be seen from FIG. 4 that the composite oxide has a Seebeck coefficient which is more than 100 $\mu$V/K and which increases with temperature. In terms of temperature dependency, a similar tendency was observed in each of the subsequent Examples. Specifically, the Seeback coefficient was more than 100 $\mu$V/K at 200K or higher.

Figure 5:
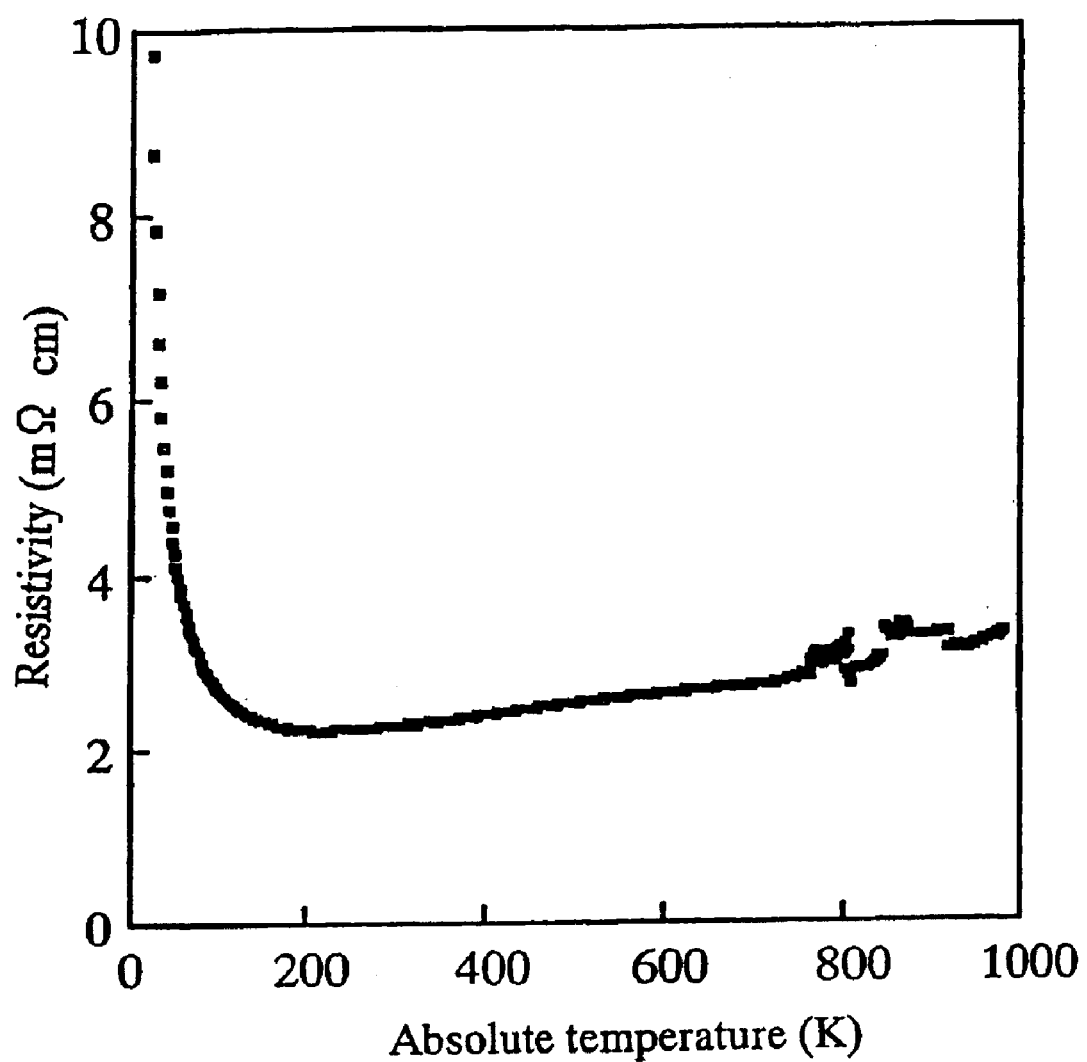
FIG. 5 is a graph showing the temperature dependency of the electrical resistivity of the composite oxide single crystal obtained in Example 1.

FIG. 5 is a graph showing the temperature dependency of the electrical resistivity ($\rho$) at 100 to 975K (absolute temperature) for the above composite oxide. A similar tendency was observed in terms of temperature dependency in all of the subsequent Examples.

EXAMPLES 2 TO 25

In each of these examples, starting materials were mixed at the ratios shown in the column titled "Starting composition" in Tables 1 and 2, and a composite oxide single crystal was prepared in the same manner as in Example 1. That is, the mixture of starting materials were calcined and crashed, followed by preparation of a crystalline product. Subsequently, the crystalline product was heated under the heat treatment temperature, heat treatment time length and oxygen flow conditions specified in Tables 1 and 2, thereby growing a composite oxide single crystal on the surface of the sintered product.

Tables 1 and 2 also show the average composition, the electrical resistivity at 973K, and the Seebeck coefficient at 973K for each of the obtained single crystals. The composite oxide single crystals obtained in Examples 1 to 14 has a laminated structure in which two types of layers alternate in the direction of the c-axis. One type is a $CoO_2$ layer wherein unit cells, in each of which six oxygen atoms are octahedrally coordinated around one Co atom, are spread sheetwise so that adjacent cells share one edge. The other type is a rock-salt-type (NaCl) layer wherein atoms are arranged in the order of MO-M'O-M'O-MO (where M is Sr or Ca, and M' is Bi or Pb). The composite oxide single crystals obtained in Examples 15 to 25 has a laminated structure in which two types of layers alternate in the direction of the c-axis. One type is a $CoO_2$ layer wherein unit cells, in each of which six oxygen atoms are octahedrally coordinated around one Co atom, are spread sheetwise so that adjacent cells share one edge. The other type is a rock-salt-type (NaCl) layer wherein atoms are arranged in the order of M"O—CoO-M"O (where M" is Ca, Sr or Bi).

In Examples 2 to 25, the following compounds were used as raw substances.

Bi source: bismuth oxide ($Bi_2O_3$)
Pb source: lead oxide (PbO)
Sr source: strontium carbonate ($SrCO_3$)
Ca source: calcium carbonate ($CaCO_3$)
Co source: cobalt oxide ($Co_3O_4$)
Te source: tellurium oxide ($TeO_2$)

TABLE 1

| Ex. | Starting composition Bi:Pb:Sr:Ca:Co:Te | Heat treatment tmp. Heat treatment time length Oxygen flow rate | Average composition of single crystal Bi:Pb:Sr:Ca:Co:O | Seebeck coefficient $\mu VK^{-1}$ | Resistivity $m\Omega\ cm$ |
|---|---|---|---|---|---|
| 1 | 2.0:0:2.0:2.0:2.0:0.5 | 920° C. 100 hours 150 ml | 2.1:0:2.0:0.3:2.0:8.7 | 220 | 3.1 |
| 2 | 2.0:0:2.0:2.0:2.0:1.0 | 880° C. 300 hours 150 ml | 2.2:0:2.1:0.2:2.0:8.6 | 195 | 2.8 |
| 3 | 2.0:0:2.0:2.0:2.0:1.5 | 940° C. 60 hours 300 ml | 2.1:0:2.1:0.1:2.0:9.0 | 180 | 3.0 |
| 4 | 1.8:0:1.8:1.8:2.0:0.5 | 920° C. 100 hours 150 ml | 2.0:0:1.9:0.2:2.0:8.8 | 185 | 2.9 |
| 5 | 1.8:0:1.8:1.8:2.0:1.0 | 940° C. 300 hours 300 ml | 2.0:0:2.0:0.1:2.0:8.9 | 190 | 3.2 |
| 6 | 1.8:0:1.8:1.8:2.0:1.5 | 940° C. 300 hours 0 ml | 2.1:0:2.2:0.1:2.0:8.5 | 190 | 3.2 |
| 7 | 2.5:0:2.5:2.5:2.0:0.5 | 860° C. 300 hours 150 ml | 2.4:0:2.3:0.5:2.0:8.8 | 185 | 2.5 |
| 8 | 2.5:0:2.5:2.5:2.0:1.0 | 880° C. 300 hours 150 ml | 2.3:0:2.2:0.3:2.0:8.6 | 210 | 3.2 |
| 9 | 2.5:0:2.5:2.5:2.0:1.5 | 900° C. 300 hours 150 ml | 2.3:0:2.3:0.3:2.0:8.7 | 200 | 3.0 |
| 10 | 2.0:0:1.8:1.8:2.0:0.5 | 880° C. 100 hours 150 ml | 2.0:0:1.9:0.2:2.0:8.9 | 180 | 3.4 |
| 11 | 1.8:0:2.0:1.8:2.0:0.5 | 940° C. 300 hours 300 ml | 2.0:0:2.0:0.3:2.0:8.9 | 170 | 2.6 |
| 12 | 1.6:0.6:2.0:1.8:2.0:0.5 | 880° C. 100 hours 150 ml | 1.5:0.5:2.0:0.2:2.0:8.7 | 220 | 2.4 |
| 13 | 1.8:0.2:2.0:1.8:2.0:0.5 | 880° C. 100 hours 150 ml | 1.8:0.1:2.1:0.3:2.0:8.9 | 240 | 2.5 |
| 14 | 1.8:0.6:2.0:1.8:2.0:0.5 | 880° C. 100 hours 150 ml | 1.8:0.3:1.9:0.2:2.0:9.0 | 250 | 2.4 |

TABLE 2

| Ex. | Starting composition Bi:Sr:Ca:Co:Te | Heat treatment tmp. Heat treatment time length Oxygen flow rate | Average composition of single crystal Ca:Sr:Bi:Co:O | Seebeck coefficient $\mu VK^{-1}$ | Resistivity $m\Omega$ cm |
|---|---|---|---|---|---|
| 15 | 1.0:1.0:1.0:2.0:0.5 | 900° C. 100 hours 150 ml | 1.7:0.2:0.2:2.0:4.8 | 200 | 1.3 |
| 16 | 1.0:1.0:1.0:2.0:1.0 | 880° C. 300 hours 150 ml | 1.6:0.3:0.3:2.0:4.7 | 190 | 1.4 |
| 17 | 1.0:1.0:1.0:2.0:1.5 | 920° C. 60 hours 300 ml | 1.4:0.2:0.2:2.0:4.9 | 185 | 1.2 |
| 18 | 0.5:0.5:0.5:2.0:0.5 | 900° C. 100 hours 150 ml | 1.4:0.3:0.4:2.0:4.9 | 175 | 1.6 |
| 19 | 0.5:0.5:0.5:2.0:1.0 | 920° C. 300 hours 300 ml | 1.4:0.4:0.3:2.0:4.8 | 190 | 1.8 |
| 20 | 0.5:0.5:0.5:2.0:1.5 | 940° C. 300 hours 0 ml | 1.4:0.3:0.3:2.0:4.5 | 180 | 2.0 |
| 21 | 1.5:1.5:1.5:2.0:0.5 | 860° C. 300 hours 150 ml | 1.7:0.4:0.3:2.0:4.7 | 170 | 1.7 |
| 22 | 1.5:1.5:1.5:2.0:1.0 | 880° C. 300 hours 150 ml | 1.6:0.5:0.3:2.0:4.8 | 185 | 2.0 |
| 23 | 1.5:1.5:1.5:2.0:1.5 | 880° C. 300 hours 150 ml | 1.7:0.4:0.2:2.0:4.7 | 200 | 1.5 |
| 24 | 1.0:0.5:0.5:2.0:0.5 | 860° C. 100 hours 150 ml | 1.4:0.6:0.3:2.0:4.8 | 190 | 1.8 |
| 25 | 0.5:1.0:0.5:2.0:0.5 | 920° C. 300 hours 300 ml | 1.5:0.4:0.3:2.0:4.9 | 170 | 1.4 |

What is claimed is:

1. A method for producing a composite oxide single crystal comprising the step of heating a mixture of raw substances in an oxygen-containing atmosphere at a temperature below the melting point of any of the raw substances, the mixture of raw substances comprising a Bi-containing substance, a Sr-containing substance, a Ca-containing substance, a Co-containing substance and a Te-containing substance, or the mixture of raw substances comprising the above-mentioned substances and a Pb-containing substance.

2. The method for producing a composite oxide single crystal according to claim 1, wherein the composite oxide single crystal is a fibrous single crystal grown from the surface of a sintered product.

3. The method for producing a composite oxide single crystal according to claim 1, wherein the mixture of raw substances is heated at a temperature of 800 to 1,000° C.

4. The method for producing a composite oxide single crystal according to any one of claims 1 to 3, wherein the Bi-containing substance, Pb-containing substance, Sr-containing substance, Ca-containing substance and Co-containing substance are present in the mixture of raw substances at a Bi/Pb/Sr/Ca/Co/Te atomic ratio of 1.6–2.5/0–0.6/1.8–2.5/1.8–2.5/2.0/0.5–1.5, and wherein the formed oxide single crystal has an average composition represented by $Bi_{1.5-3.1}Pb_{0-0.5}Sr_{1.3-2.2}Ca_{0-0.8}Co_2O_{9-x}$ ($0 \leq x \leq 1.0$).

5. The method for producing a composite oxide single crystal according to any one of claims 1 to 3, wherein the Bi-containing substance, Sr-containing substance, Ca-containing substance and Co-containing substance are present in the mixture of raw substances at a Bi/Sr/Ca/Co/Te atomic ratio of 1.8–2.5/1.8–2.5/1.8–2.5/2.0/0.5–1.5, and wherein the formed oxide single crystal has an average composition represented by $Bi_{1.9-3.1}Sr_{1.3-2.2}Ca_{0-0.8}Co_2O_{9-x}$ ($0 \leq x \leq 1.0$).

6. The method for producing a composite oxide single crystal according to any one of claims 1 to 3, wherein the Bi-containing substance, Sr-containing substance, Ca-containing substance and Co-containing substance are present in the mixture of raw substances at a Bi/Sr/Ca/Co/Te atomic ratio of 0.5–1.5/0.5–1.5/0.5–1.5/2.0/0.5–1.5, and wherein the formed oxide single crystal has an average composition represented by $Ca_{1.3-3.0}Sr_{0-0.5}Bi_{0-0.5}Co_2O_{5-x}$ ($0 \leq x \leq 1.0$).

* * * * *

UNITED STATES PATENT AND TRADEMARK OFFICE
CERTIFICATE OF CORRECTION

PATENT NO.    : 6,860,938 B2
DATED         : March 1, 2005
INVENTOR(S)   : Ryoji Funahashi, Ichiro Matsubara and Masahiro Shikano It is certified that error appears in the above-identified patent and that said Letters Patent is hereby corrected as shown below:

<u>Title page,</u>
Item [73], Assignee, please delete "National Institute of Advanced Technology" and insert therefore -- National Institute of Advanced Industrial Science and Technology --.

Signed and Sealed this

Twenty-third Day of August, 2005

JON W. DUDAS
*Director of the United States Patent and Trademark Office*